(12) United States Patent
Taylor et al.

(10) Patent No.: US 6,617,670 B2
(45) Date of Patent: Sep. 9, 2003

(54) SURFACE PIN DEVICE

(75) Inventors: Gordon C. Taylor, Princeton, NJ (US); Arye Rosen, Cherry Hill, NJ (US); Aly E. Fathy, Longhorne, PA (US); Pradyumna K. Swain, Franklin Park, NJ (US); Stewart M. Perlow, Marlboro, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/812,702

(22) Filed: Mar. 20, 2001

(65) Prior Publication Data

US 2001/0049180 A1 Dec. 6, 2001

Related U.S. Application Data

(60) Provisional application No. 60/190,686, filed on Mar. 20, 2000, and provisional application No. 60/245,838, filed on Nov. 3, 2000.

(51) Int. Cl.[7] .............................................. H01L 31/075
(52) U.S. Cl. ..................... 257/656; 257/458; 257/506; 257/594
(58) Field of Search ................................. 257/506, 594, 257/656, 458

(56) References Cited

U.S. PATENT DOCUMENTS

| 4,751,513 A | * | 6/1988 | Daryoush et al. .... 343/700 MS |
| 5,864,322 A | | 1/1999 | Pollon et al. ................ 343/909 |
| 6,020,853 A | * | 2/2000 | Richards et al. ..... 343/700 MS |

FOREIGN PATENT DOCUMENTS

| JP | 57 128983 A | 8/1982 | ........... H01L/29/91 |

OTHER PUBLICATIONS

"Optically Controlled Lateral PIN Diodes and Microwave Control Circuits", P. J. Stabile et al., RCA Review, RCA Corp. Princeton, NJ, US, vol. 47, No. 4, Dec. 1, 1986, pp. 443–456.

"Dielectrically Isolated Lateral High Voltage P–i–N Rectifiers for Power ICs", S. Sridhar et al., 1992 Int. Electron Devices Meeting (IEDM), New York, IEEE, US, Dec. 13, 1992, pp. 245–248.

PCT International Search Report, PCT/US01/08930, international filing date Mar. 2, 2001.

* cited by examiner

*Primary Examiner*—Jerome Jackson
(74) *Attorney, Agent, or Firm*—William J. Burke

(57) ABSTRACT

A surface PIN (SPIN) device and a method of fabricating such a SPIN device. The SPIN device, when activated, confines carrier injection to a small volume near the surface of the device such that the device is sufficiently conductive to simulate a planar conductor. The SPIN device comprises a P+ region and an N+ region formed in an intrinsic (I) layer. The P+ and N+ regions are separated by a lateral length of intrinsic material of length L. The length L is approximately the carrier diffusion length. When DC bias is applied across the N+ and P+ regions carriers are injected into the intrinsic region at a density exceeding $10^{18}$ carriers per cubic cm. The intrinsic region is sufficiently thin to confine the carriers near the surface of the intrinsic region. As such, in the "on" state, the SPIN device simulates a conductive material. In the "off" state, the SPIN device is no longer conductive. Consequently, a planar array of SPIN devices can be fabricated and selectively activated to form a dynamic, reconfigurable antenna.

10 Claims, 3 Drawing Sheets

SURFACE PIN DEVICE

CROSS-REFERENCE TO RELATED APPLICATIONS

This application claims benefit of U.S. provisional patent application serial No. 60/190,686, filed Mar. 20, 2000, and No. 60/245,838, filed Nov. 3, 2000, which are herein incorporated by reference.

This invention was made with U.S. government support under contract number N66001-99-C-8643. The U.S. government has certain rights in this invention.

BACKGROUND OF THE INVENTION

1. Field of the Invention

The invention relates to semiconductor devices and, more particularly, the invention relates to a surface PIN device and a method of manufacturing same.

2. Description of the Related Art

Planar surface antennas and other conductive structures generally rely on the use of metallization deposited upon a substrate to form the metal structures. These structures are not very accommodating to alterations or dynamic reconfiguration. Such changeable or reconfigurable structures are approximated by depositing an array of metal patches that are interconnected by switching devices or other semiconductor devices. By actively switching the devices on or off, various patches can be conductively interconnected to form various shapes of conductive structures. Such switched patches are not effective in forming antennas because the inactive patches interfere with the radiation patterns generated by the active patches. The inactive patches become passive radiators and cause parasitic anomalies in the radiation pattern.

Therefore, there is a need in the art for a method and apparatus that simulates metallization using a semiconductor-based structure.

SUMMARY OF THE INVENTION

The present invention is a surface PIN (SPIN) device and a method of fabricating such a SPIN device. The SPIN device, when activated, confines carrier injection to a small volume near the surface of the device such that the device is sufficiently conductive to simulate a planar conductor. The SPIN device comprises a P+ region and an N+ region formed in an intrinsic (I) layer. The P+ and N+ regions are separated by a lateral length of intrinsic material of length L. The length L is approximately the carrier diffusion length. When DC bias is applied across the N+ and P+ regions carriers are injected into the intrinsic region at a density exceeding $10^{18}$ carriers per $cm^3$. The intrinsic region is sufficiently thin to confine the carriers near the surface of the intrinsic region. As such, in the "on" state, the SPIN device simulates a conductive material. In the "off" state, the SPIN device is no longer conductive. Consequently, a planar array of SPIN devices can be fabricated and selectively activated to form a dynamic, reconfigurable antenna.

BRIEF DESCRIPTION OF THE DRAWINGS

So that the manner in which the above recited features, of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
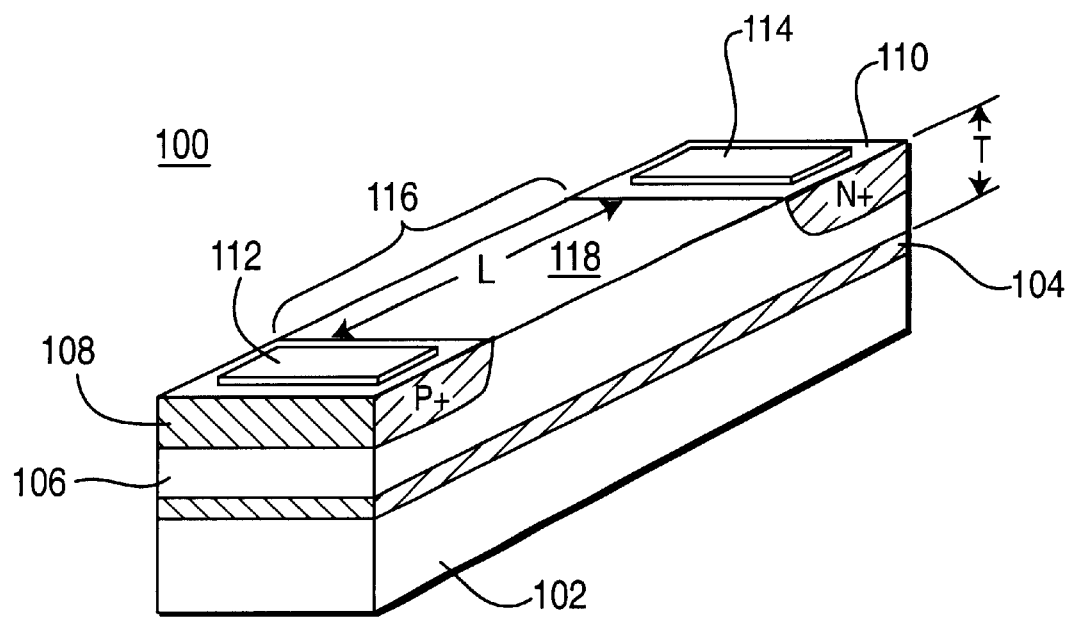
FIG. 1 depicts a perspective view of a SPIN device.

FIG. 1 depicts a surface PIN (SPIN) device 100 comprising a silicon substrate 102, an oxide layer 104, and intrinsic layer 106, a P+ region 108, an N+ region 110, and metal contacts 112 and 114. The P+ region 108 is separated from the N+ region 110 by a portion 116 of intrinsic material having a length L. The length L of portion 116 is approximately the carrier diffusion length. By selecting the length L as approximately the carrier diffusion length, the carrier density in the intrinsic region will be at least $10^{18}$ carriers per $cm^3$. This is sufficient to cause the surface 118 of portion 116 to become conductor-like.

The carrier diffusion length is the square root of the carrier lifetime multiplied by the diffusion constant. For example, the carrier lifetime is approximately 5 microseconds and the diffusion constant is approximately 35 $cm^2/sec$. As such, a conservative estimate of the length L is 100 micrometers. For higher carrier density, the diffusion length is lower. The thickness of the intrinsic layer is approximately 50 micrometers. Such a thickness confines the carriers to the surface of the intrinsic region. In a reconfigurable antenna application for the SPIN device that is described in detail in U.S. patent application Ser. No. 09/812,701, filed simultaneously herewith and incorporated herein by reference, the thickness T is approximately three times the skin depth for the frequency being received/radiated by the antenna.

The metal contact pads 112 and 114 are relatively small, e.g., one-tenth of the length L. Such a small size for the contact pads makes the SPIN device electrically invisible when the device is not activated.

To isolate the SPIN devices from one another when the devices are arranged in an array, deep vertical trenches can be etched around each SPIN device. Consequently, an array of addressable SPIN devices can be fabricated. The trenches should be wider than the recombination length, e.g., about 3 micrometers.

In operation, DC power is applied to the metal contacts 112 and 114 causing carriers (holes and electrons) to be injected into the lateral portion 116 of intrinsic region 106. The injection of carriers forms a dense plasma in the intrinsic region 106. If the length L and thickness T are currently selected the carrier density near the surface of the SPIN device should be between $10^{18}$ and $10^{19}$ carriers per $cm^3$.

Figure 2A:
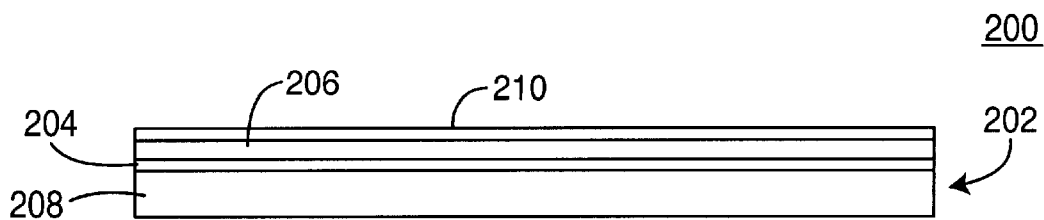
FIGS. 2A–2L together depict the process steps used to form a SPIN device in accordance with the invention.
Figure 2B:
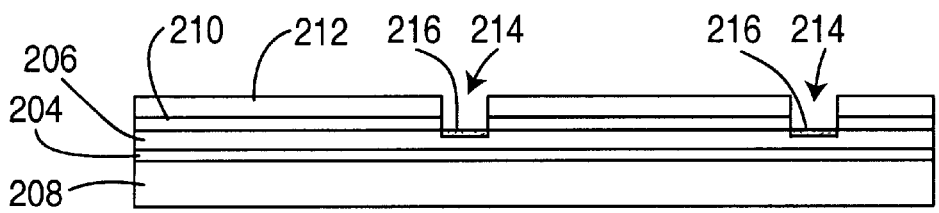

FIGS. 2A through 2L depict one embodiment of a sequence of steps (method 200) used in fabricating the SPIN device 100 of FIG. 1. The method 200 begins in FIG. 2A wherein a substrate comprising a bonded wafer 202 having a 1 um thick barrier oxide layer 204 between a 40 um thick intrinsic layer 206 and the silicon wafer 208. The intrinsic layer 206 is a lightly doped N-type region. A thermal field oxide layer 210 is grown to a thickness of 0.85 um atop the intrinsic layer 206. As shown in FIG. 2B, a photoresist layer 212 is deposited and patterned to form openings 214 for implanting phosphorous. Phosphorous is implanted through the openings 214 at 100 KeV to a density of $2 \times 10^{16}$ electrons per $cm^3$ such that an N+ region 216 is formed.

Figure 2C:
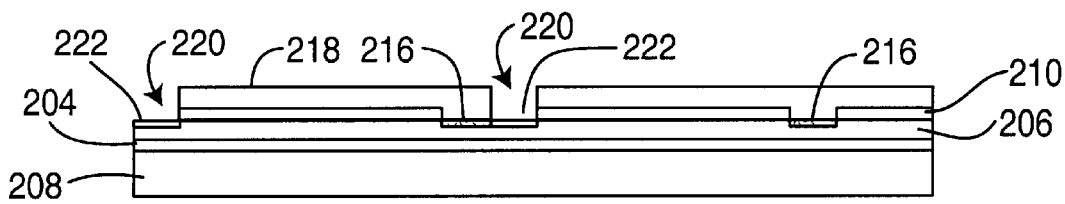

As shown in FIG. 2C, a photoresist layer 218 is deposited and patterned to form openings 220 for implanting boron. Boron is implanted through the openings 220 at 100 KeV to a density of $2 \times 10^{16}$ holes per $CM^3$ such that an P+ regions 222 is formed.

Figure 2D:
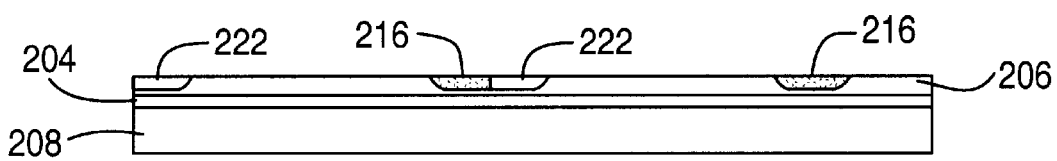

At FIG. 2D, the diffusion is driven by heating the substrate to 1200 degrees C. for approximately 5.5 hours. Then the field oxide layer 210 is stripped.

Figure 2E:
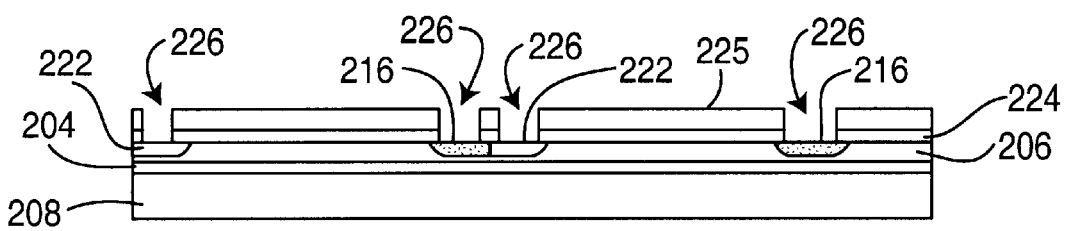

At FIG. 2E, a 1 um thick layer 224 of plasma enhanced oxide is deposited over the structure of FIG. 2D. Using a patterned photoresist layer 225, a contact opening 226 is formed in the oxide layer 224 above both the N+ region 216 and the P+ region 222.

Figure 2F:
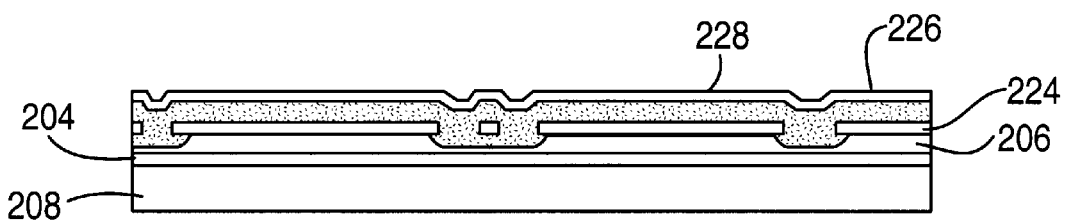

At FIG. 2F, an aluminum layer 226 is sputtered onto the structure of FIG. 2E to a thickness of 2 um and the aluminum is capped with a 9 nm thick layer 228 of titanium.

Figure 2G:
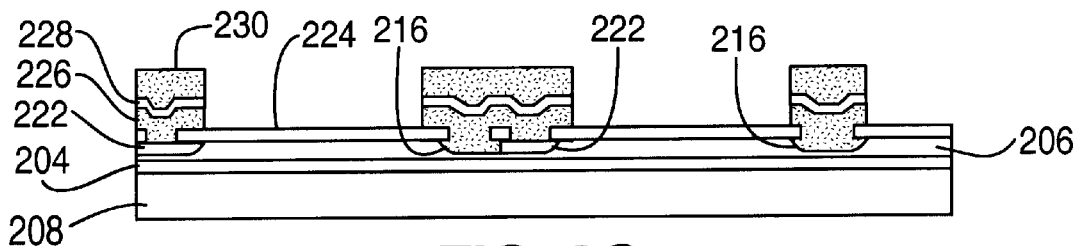

At FIG. 2G, a photoresist layer 230 is deposited and patterned to define the metal contacts. The aluminum layer 228 is then etched to remove the excess material and form the metal contacts 242.

Figure 2H:
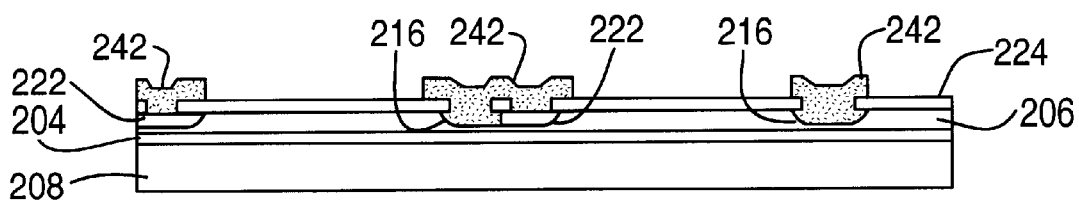
Figure 2I:
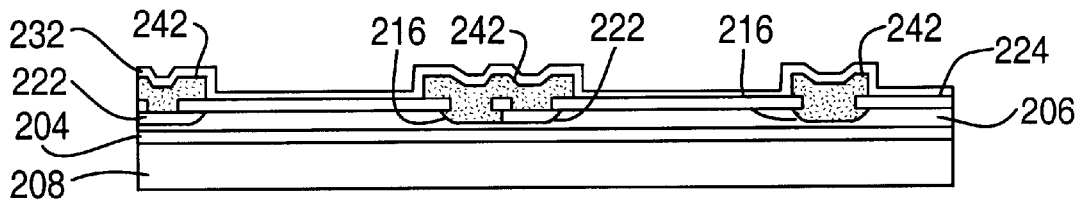
Figure 2J:
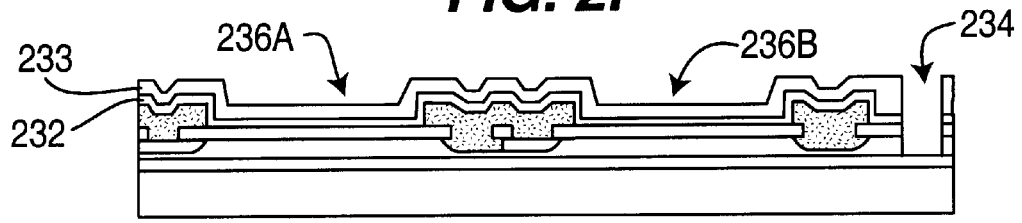
Figure 2K:
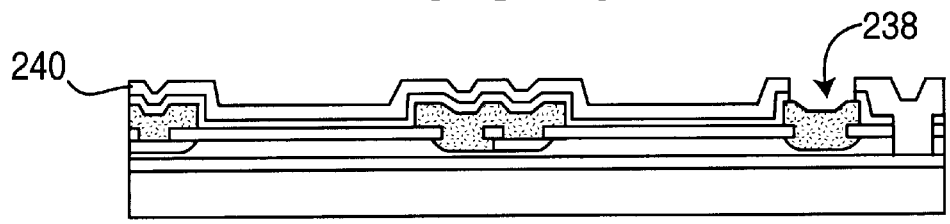
Figure 2L:
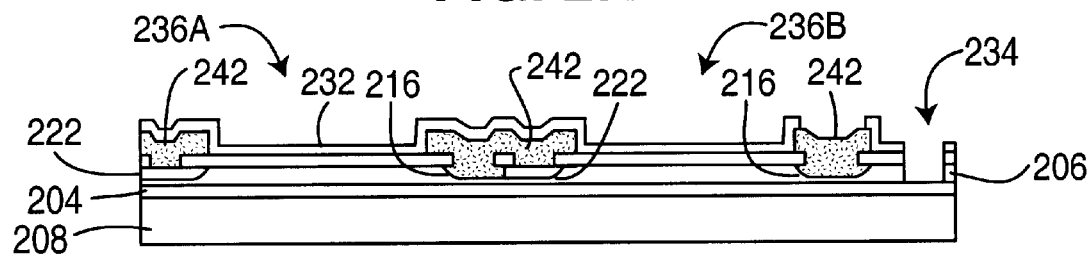

At FIG. 2H, the metallized structure is sintered for 20 minutes at about 450 degrees C. At FIG. 2I, a 1.2 um thick layer 232 of plasma enhanced oxide is deposited on the structure of FIG. 2H. At FIG. 2J, the trench pattern is defined by a patterned photoresist layer 233 to isolate neighboring devices 236A and 236B and the trench 234 is etched. The trench has a width of about 2–3 times the carrier diffusion length. At FIG. 2K, the bond pad area 238 is defined by a photoresist layer 240 and the oxide is removed using a plasma etch. At FIG. 2L, the photoresist layer 240 used to define the pad area 238 is removed.

The resulting structure 236 is an array of SPIN devices 236A and 236B that are isolated from one another by a trench 234. DC drive electronics can be coupled to each of the SPIN devices 236A and 236B via the contacts 242 to selectively activate them.

Figure 3:
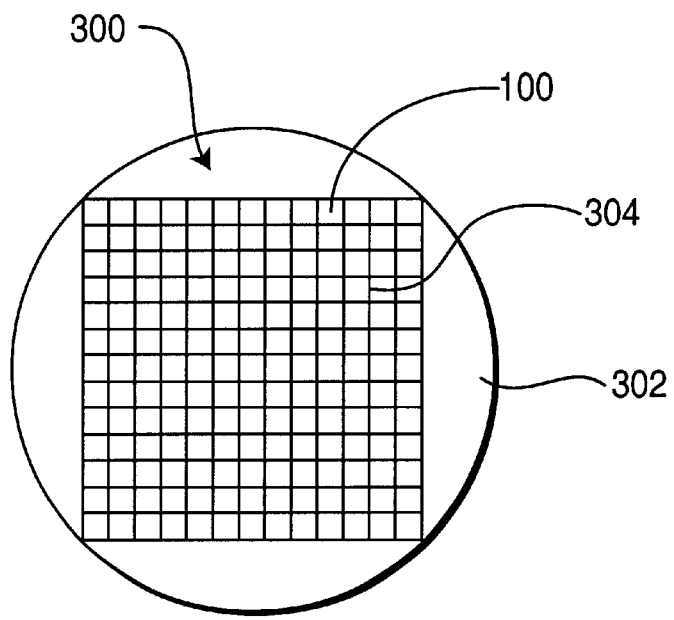
FIG. 3 depicts a top plan view of an array of SPIN devices.

FIG. 3 depicts a top plan view of an array 300 of SPIN devices 100 fabricated on a substrate 302. All of the devices 100 can be formed simultaneously using the process described with respect to FIGS. 2A through 2L. The devices 100 are separated from one another by trenches 304. The trenches have a width of about 2–3 times the carrier diffusion length. Alternatively, the SPIN devices 100 may be separated by a predefined distance that mitigates interference between the devices without using a trench. Each of the SPIN devices in the array can be individually activated by a DC current. Upon activation, the SPIN device forms a plasma in the intrinsic region having a conductivity that approximates the conductivity of a metal. By selectively activating the SPIN devices 100 in the array 300, various planar metal-like structures can be formed and then electronically reconfigured. One application of the array 300 is a reconfigurable antenna array that is disclosed in detail in U.S. patent application Ser. Nos. 09/772,094, filed Jan. 26, 2001 and 09/812,701, filed simultaneously herewith and incorporated herein by reference in its entirety.

While foregoing is directed to the preferred embodiment of the present invention, other and further embodiments of the invention may be devised without departing from the basic scope thereof, and the scope thereof is determined by the claims that follow.

What is claimed is:

1. A surface PIN (SPIN) device comprising:
   an intrinsic region;
   a P+ region formed in the intrinsic region;
   a N+ region formed in the intrinsic region;
   where the P+ region and N+ region are laterally disposed from one another by a portion of the intrinsic region; and
   where the intrinsic region is adapted to confine at least $10^{18}$ carriers per $cm^3$ near a surface of the intrinsic region such that the surface becomes conductive.

2. The SPIN device of claim 1 wherein the P+ region is formed by implantation of boron.

3. The SPIN device of claim 1 wherein the N+ region is formed by implantation of phosphorous.

4. The SPIN device of claim 1 wherein the N+ region and P+ region are laterally separated by a distance approximately equal to a carrier diffusion length.

5. The SPIN device of claim 4 wherein the distance is a function of the carrier diffusion length.

6. The SPIN device of claim 1 wherein the intrinsic region has a thickness of about 50 um.

7. The SPIN device of claim 1 further comprising a trench surrounding the intrinsic region.

8. The SPIN device of claim 7 wherein the trench is wider than a distance of 2 to 3 times a carrier diffusion length.

9. The SPIN device of claim 1 further comprising metal contacts for the P+ region and the N+ region, wherein a length of the metal contacts are less than one-tenth the length of a distance between the N+ region and the P+ region.

10. A surface PIN (SPIN) device comprising:
    a intrinsic region;
    a P+ region formed in the intrinsic region;
    a N+ region formed in the intrinsic region;
    where the P+ region and N+ region are laterally disposed from one another by a portion of the intrinsic region and a distance between the N+ region and the P+ region and a thickness of the intrinsic region result in a carrier density of at least $10^{18}$ carriers per $cm^3$.

* * * * *